United States Patent [19]
Mehta et al.

[11] Patent Number: 5,795,627
[45] Date of Patent: Aug. 18, 1998

[54] METHOD FOR ANNEALING DAMAGED SEMICONDUCTOR REGIONS ALLOWING FOR ENHANCED OXIDE GROWTH

[75] Inventors: Sunil Mehta, San Jose; Emi Ishida, Sunnyvale; Xiao-Yu Li, San Jose, all of Calif.

[73] Assignee: Advanced Micro Devices, Inc., Sunnyvale, Calif.

[21] Appl. No.: 799,236

[22] Filed: Feb. 14, 1997

[51] Int. Cl.$^6$ .................................... C23C 14/04
[52] U.S. Cl. .................. 427/526; 427/259; 427/264; 427/270; 427/272; 427/282; 427/299; 427/384; 427/407.1; 427/419.2; 427/526; 427/527; 427/529; 427/555; 427/558; 427/596; 437/19; 437/20; 437/228
[58] Field of Search .................. 427/526, 527, 427/529, 555, 558, 596, 259, 264, 270, 272, 282, 299, 384, 407.1, 419.2; 437/19, 20, 228

[56] References Cited

U.S. PATENT DOCUMENTS

| | | | |
|---|---|---|---|
| 4,482,393 | 11/1984 | Nishiyama et al. | 148/1.5 |
| 4,500,365 | 2/1985 | Mori | 148/1.5 |
| 4,924,278 | 5/1990 | Logie | 357/23.5 |
| 5,227,329 | 7/1993 | Kobayashi et al. | 437/101 |
| 5,316,969 | 5/1994 | Ishida et al. | 437/168 |
| 5,514,880 | 5/1996 | Nishimura et al. | 257/70 |
| 5,620,931 | 4/1997 | Tsang et al. | 438/50 |

*Primary Examiner*—Bernard Pianalto
*Attorney, Agent, or Firm*—Fliesler, Dubb, Meyer & Lovejoy LLP

[57] ABSTRACT

A method of forming an oxide enhancing region, such as phosphorus, in a semiconductor substrate with minimal damage is provided. The method includes the steps of forming an oxide enhancing region in the semiconductor substrate to a depth below the semiconductor substrate. A 308 nm excimer laser is then applied to the oxide enhancing region in order to reduce the damage caused by forming the oxide enhancing region. A uniform and reliable oxide layer is then formed on the surface of the substrate over the damage reduced oxide enhancing region.

24 Claims, 3 Drawing Sheets

METHOD FOR ANNEALING DAMAGED SEMICONDUCTOR REGIONS ALLOWING FOR ENHANCED OXIDE GROWTH

CROSS-REFERENCE TO RELATED APPLICATIONS

The following co-pending U.S. patent applications are assigned to the assignee of the present application, are related to the present application and its disclosure and are incorporated herein by reference:

(A) Ser. No. 08/799,230 [Attorney Docket No. AMDI8196MCF/LEV] by E. Ishida, et al. and entitled METHOD OF SELECTIVELY ANNEALING DAMAGED DOPED REGIONS.

(B) Ser. No. 08/799,153 [Attorney Docket No. AMDI8197MCF/LEV] by E. Ishida, et al. and entitled METHOD AND APPARATUS INCORPORATING NITROGEN SELECTIVELY FOR DIFFERENTIAL OXIDE GROWTH.

(C) Ser. No. 08/799,235 [Attorney Docket No. AMDI8202MCF/KJD] by E. Ishida, et al. and entitled A METHOD TO INCORPORATE, AND A DEVICE HAVING, OXIDE ENHANCEMENT DOPANTS USING GAS IMMERSION LASER DOPING (GILD) FOR SELECTIVELY GROWING AN OXIDE LAYER.

(D) Ser. No. 08/689,523 by Barsan, et al. and entitled AN INTEGRATED CIRCUIT HAVING, AND PROCESS PROVIDING, DIFFERENT OXIDE LAYER THICKNESSES ON A SUBSTRATE.

(E) Ser. No. 08/561,306, U.S. Pat. No. 5,672,521, by Barsan, et al. and entitled MULTIPLE GATE OXIDE THICKNESSES ON A WAFER SUBSTRATE.

(F) Ser. No. 08/699,401 by Mehta, entitled OXIDE FORMATION PROCESS FOR MANUFACTURING PROGRAMMABLE LOGIC DEVICE.

CROSS REFERENCE TO RELATED PATENTS

The following U.S. patent is assigned to the assignee of the present application, is related to the present application and its disclosure is incorporated herein by reference:

(A) U.S. Pat. No. 4,924,278 issued May 8, 1990, to Logie and entitled EEPROM USING A MERGE SOURCE AND CONTROL GATE.

BACKGROUND OF THE INVENTION

1. Field of the Invention

The invention relates to forming an oxide region on a semiconductor substrate.

2. Description of the Related Art

A prevalent trend in the semiconductor industry is to increase the density of semiconductor devices formed on silicon substrates.

Programmable logic devices (PLD) are circuits which can be configured by a user to perform logic functions or serve as memory arrays. Generally, PLDs include a programmable array of cells and array control circuitry which is utilized to program the array with the desired implementation. The programmable array comprises a series of low-voltage, short channel floating gate transistors which store charge to reflect whether a particular cell is programmed with a bit of data. The programmed array reflects a particular user's individual configuration for the programmable device, allowing users to customize the programmable logic device for a number of different applications.

One type of programmable logic device which has become popular due to its performance and cost characteristics are electrically erasable complementary metal oxide semiconductor ($E^2CMOS$) PLDs.

$E^2CMOS$ technology is based on the concept of a stored charge on a floating gate. Electrons are transferred to the gate through a physical mechanism known as Fowler-Nordheim tunneling. For an electrically erasable cell, a tunnel oxide is present between the source and drain regions and the floating gate that is about one-third of the thickness of a traditional transistor gate oxide. Fowler-Nordheim tunneling involves placing a potential across the tunnel oxide which distorts the electric field and allows electrons to traverse the tunnel oxide upon which they become trapped on a floating gate.

The control circuitry of the cell—the program transistors or so-called write transistors—essentially comprise high voltage transistors capable of sustaining high electric fields. So called read transistors, which operate at low voltage, include a first junction, second junction and gate (defined by the word line of the device). The control gate includes the program junction which is separated from the floating gate by an oxide layer having a thickness of approximately 180 Å. The program transistor includes a first junction, second junction and a gate which also rests on the oxide layer. The memory cell will also include a floating gate, separated from the program junction by a tunnel oxide which may be activated by the control gate. The thickness of tunnel oxide is in a range of approximately 80–100 Å.

When programming or erasing the device, a voltage is applied between the program and control gate nodes. The direction of the voltage determines whether the cell is erased or programmed. When erasing, the control gate is given a positive voltage and the program node is grounded. When programming, the program node voltage is elevated and the control gate is grounded.

Several alternative designs of memory cells are utilized. Characteristically, in an $E^2CMOS$ PLD, four types of transistors are required: high voltage P channel, high voltage N channel, low voltage P channel, and low voltage N channel.

The trend of $E^2CMOS$ PLD devices has been toward lower and lower supply voltages. Consequently, this has required a corresponding scaling down of the oxide layers in the various transistors and at the program junctions. As the oxide thicknesses have been reduced, it is particularly important that the program junction oxide is uniform and of high quality in order to ensure reliable electrical characteristics.

U.S. patent applications entitled AN INTEGRATED CIRCUIT HAVING, AND PROCESS PROVIDING, DIFFERENT OXIDE LAYER THICKNESSES ON A SUBSTRATE and MULTIPLE GATE OXIDE THICKNESSES ON A WAFER SUBSTRATE referenced above discloses methods for forming different oxide thicknesses on a semiconductor substrate. In particular, these applications disclose a method for forming a write transistor with a first oxide thickness, a read transistor with a second oxide thickness and a tunnel oxide with a third oxide thickness.

In formation of oxides in general, it is generally known that the provision of phosphorus or arsenic into the silicon substrate prior to forming the oxide by thermal formation in an oxygen atmosphere results in a different growth of oxide between the region overlying the phosphorus or arsenic deposited region and the region of the substrate where no phosphorus or arsenic has been deposited. However, where the oxide thicknesses are relatively small, care must be taken

3 not to damage the surface of the silicon substrate, as growth of the oxide will be impaired.

Conventionally, phosphorus or arsenic may be beam-line ion implanted at a relatively low energy into the substrate. However, ion implantation can cause substrate damage which is difficult to anneal out using conventional methods, and compromise the quality or uniformity of the oxide grown for small thicknesses. Thus, semiconductor device yield and reliability is reduced leading to higher manufacturing costs.

Therefore, it is desirable to have a method for forming reliable high quality and uniform oxide at reduced manufacturing costs. In particular, it is desirable to have a method to form a uniform relatively small thickness oxide layer over a program junction.

SUMMARY OF THE INVENTION

The invention, roughly described, comprises a method of forming a region of oxide growth enhancing impurity in a semiconductor substrate with minimal damage. The method includes the steps of forming an oxide growth enhancing impurity region in the semiconductor substrate to a depth below the semiconductor substrate; and applying laser energy to the semiconductor substrate at a sufficient magnitude to liquify the semiconductor substrate in the region, and allowing the region to cool.

In a further embodiment of the present invention, the oxide growth enhancing impurity is, for example, phosphorus. The method may further include the step of growing an oxide layer having a first thickness above the region and a second thickness.

In one aspect, the step of forming comprises ion implanting the oxide growth enhancing impurity into the substrate. In a further aspect, the step of forming comprises placing the substrate in an atmosphere containing an oxide growth enhancing compound, and applying laser energy to the surface of the substrate to complete a non-melt gas immersion laser doping ("GILD") of the phosphorus in the substrate.

In yet another aspect of the invention, the method may utilize an excimer laser such as an XeCl laser having a wavelength of 308 nm.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION OF THE PREFERRED EMBODIMENTS

In the following description, numerous details, for example, specific materials, process steps, etc., are set forth in order to provide a thorough understanding of the present invention. It will be obvious, however, to one skilled in the art that the specific details need not be employed to practice the present invention. Moreover, specific details of particular processes or structures may not be specifically presented in order not to unduly obscure the invention where such details would be readily apparent to one of average skill in the art.

Figure 1:
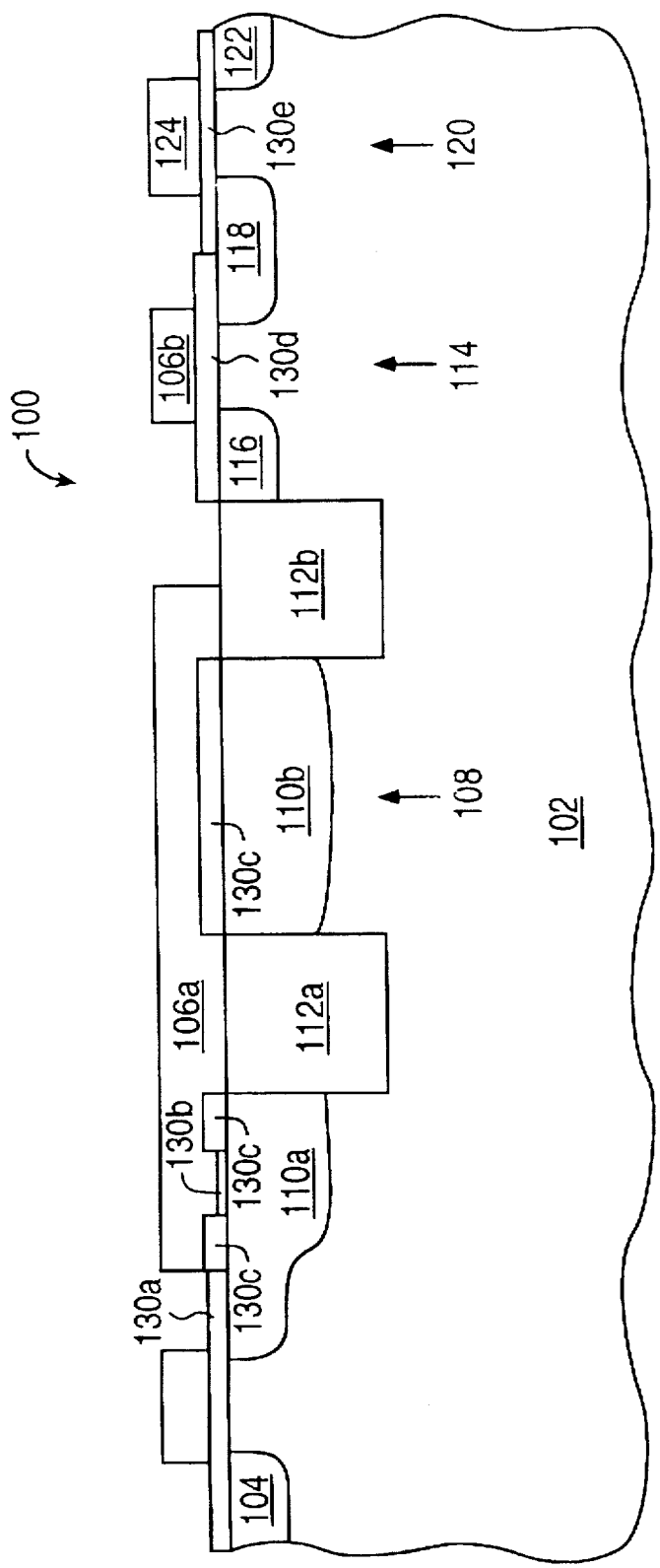
FIG. 1 is an illustrative cross-section of a conventional E²PROM memory cell which may be formed in accordance with the present invention.

FIG. 1 is an illustrative cross-section of an exemplary E²PROM memory cell. FIG. 1 does not show an actual cross section of a manufactured E²PROM cell, but rather an illustrative cross-section of the various transistors and their internal connections. The process of the present invention is useful in forming an E²PROM memory cell. However, the method of the present invention is not limited to uses with E²PROM memory technology and one of average skill in the art will readily recognize the myriad uses of the method in any application requiring a uniform oxide layer at a relatively small thickness.

As shown in FIG. 1, the E²PROM memory cell 100 is formed on a semiconductor substrate 102 having a surface 104. The cell comprises floating gates 106a–b, control gate 108 and program junctions 110a–b. Field oxide regions 112a–b separate active regions of the semiconductor devices. A sense transistor 114 is formed by junction regions 116 and 118 and floating gate 106b, while the read transistor 120 is formed by junction region 118, junction region 122 and gate 124. Various thicknesses of an oxide layer 130 cover the surface 104 of semiconductor 102. The oxide 130 has a thickness of, for example, 150 Å at region 130a, a thickness of 88 Å at region 130b, the tunnel oxide region, a thickness of 180 Å at region 130c overlying the control gate and a portion of program junction 110a, a thickness of 150 Å over the channel of sense transistor 114 at region 130d, and a thickness of 80 Å over the channel of read transistor 120 at region 130e.

These oxide thicknesses have been provided for illustrating this particular embodiment. In other embodiments, other oxide thicknesses may be used. For example, other oxide thicknesses are described in the above-referenced patent application entitled AN INTEGRATED CIRCUIT HAVING, AND PROCESS PROVIDING, DIFFERENT OXIDE LAYER THICKNESSES ON A SUBSTRATE. It should also be understood that for convenience, the oxide layers shown in the following figures is depicted growing only upwards from the oxidated surface. In actuality, the oxide layer grows bidirectionally above and below the initial surface.

Operation of memory cell 100 is also described in detail in the above-referenced patent application entitled AN INTEGRATED CIRCUIT HAVING, AND PROCESS PROVIDING, DIFFERENT OXIDE LAYER THICKNESSES ON A SUBSTRATE.

Figure 2:
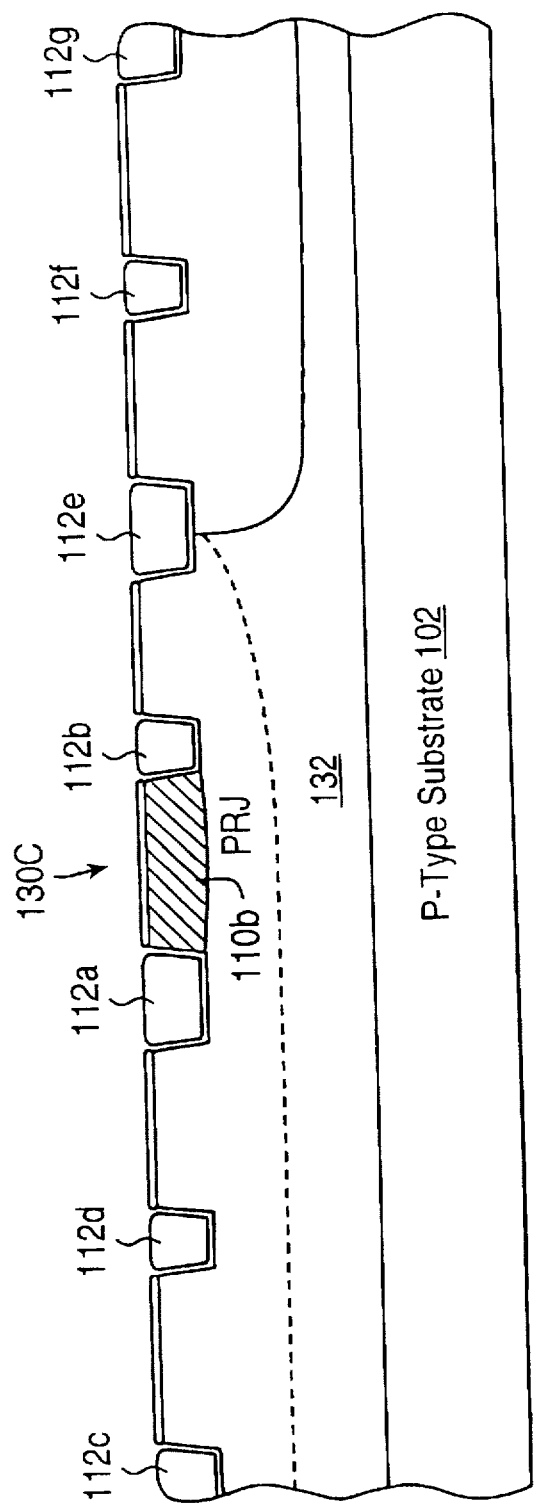
FIG. 2 is a cross-section of a semiconductor substrate during the formation of an E²PROM memory cell showing portions of the cell being formed.

FIG. 2 illustrates a procedure for forming oxides of varying thickness on a semiconductor substrate, and particularly for forming the gate oxide layer 130c of E²PROM cell 100. FIG. 2 shows substrate 102 upon which has been formed a well region 132, field oxide regions 112a–112g, an oxide layer 130c, and the program junction region 110b. It should be readily understood that numerous process steps are required to reach the cross-section representation of the substrate shown in FIG. 2.

By way of example, the wafer undergoes a number of pre-growth etching, cleaning and implant steps. More specifically, cleaning steps, barrier oxidation steps, and zero level etching steps will have been performed on the substrate 102. In addition, well implant regions may be provided in substrate 102 in accordance with known techniques. (For example, an implant of boron at $5.6 \times 10^{12}$ atom/cm.$^2$ at 60 KeV.) Subsequently, source/drain regions, isolated from each other by field oxide regions, will be formed by depositing, for example, a nitride layer of between 1,500 and 1,800 Å on the substrate, forming a source/drain mask over the nitride layer, and etching the nitride layer leaving portions of the layer covering the source/drain regions. It should be recognized that the wells may be formed subsequent to the source/drain pattern etch.

Subsequently, device isolation regions may be formed in the substrate. Such regions are typically formed by so-called shallow trench oxidation or local oxidation of silicon (LOCOS) processes. In a LOCOS process, for example, field oxide regions 112a–112g are formed in substrate 102 by placing the substrate in an atmosphere of oxygen with 0.5% HCl at a temperature of about 1,100° to 1,150° C. to form oxide regions 112a–112g having a thickness of between 3,700 and 4,300 Å. As is well known, the nitride portions remaining on the substrate cover the source/drain regions and prevent field oxidation in these regions. An etch back is subsequently performed on the field oxide layer and the nitride layer removed leaving source/drain substrate regions remaining between field oxide regions 112a–112g.

Additional conventional processing steps include: forming the program junction 110b through the use of a program junction mask layer, implant and anneal; an n-channel field mask and implant; a cell mask and implant; high-voltage n-type implant; high-voltage p-type implants; punch-through masking and implants; and a high-voltage gate oxide cleaning step.

Gate oxidation layer 130c is also conventionally formed by placing the structure shown in FIG. 2 without the associated gate oxide layer in an oxygen-containing atmosphere 900° C. for approximately thirty minutes to create a gate oxide layer having an initial thickness of approximately 125 Å on a substrate and 150 Å on a program junction. After a second oxidation which simultaneously forms the tunnel oxide 130b, oxide layers 130a and 130d have a thickness of approximately 150 Å and oxide layer 130c has a thickness of approximately 180 Å.

The process of the present invention is useful in, for example, annealing implanted phosphorus into a semiconductor substrate to a shallow junction depth in order to allow for differential oxide growth.

Conventionally, ion implantation is a useful process for providing dopants in the semiconductor substrate, but it does have certain drawbacks. With respect to providing small transistor geometries, one critical limitation is that the silicon substrate can be damaged by the implant process. Damage caused by the implant process necessitates a subsequent annealing at high temperature to cure the damage. This annealing step can itself lead to unpredictability in the migration of other dopants in the structure being processed. Often, the damage caused by the implant can't be annealed out within practical thermal budgets. In addition, the implant will cause a region of damage adjacent to the substrate surface which will prohibit the growth of extremely thin oxide layers.

An alternative form of doping which has heretofore not been widely used in processing semiconductor devices is gas immersion laser doping (GILD). Generally, with laser doping, the silicon surface is exposed to intense irradiation by an excimer laser for a period lasting only several nanoseconds (approximately 50 ns or less). During this period, the silicon surface transitions from solid to liquid, at which time dopants diffuse into the liquid silicon.

Specifically, laser doping uses an excimer laser, often as XeCl laser, as an energy source. In projection gas immersion doping (P-GILD) a reflective reticle is used. The output of the laser is directed through optics to homogenize the beam and then passed through an illuminator to scan the beam over a dielectric reticle. The reticle is then imaged, via projection optics, onto the wafer. In the illuminated areas, the incident photon energy is absorbed in approximately the top 7 nm of the silicon and converted to thermal energy, heating the surface and activating the diffusion of the impurities into the substrate. More information with respect to laser doping is contained in Weiner & McCarthy, "Fabrication of sub-40-nm p-n junctions for 0.18 μm MOS device applications using a cluster-tool-compatible, nanosecond thermal doping technique," Microelectronic Processes, Sensors, & Controls, Vol. 2091 (Int'l Soc. for Optical Eng., September 1993).

The process of the present invention can be utilized with any of the aforementioned techniques to cure damage caused by an implant or other means. As such, improved manufacturing of shallow junction depth dopant regions, small geometry transistors and, in particular, multiple thickness oxide regions, is realized.

Figure 3:
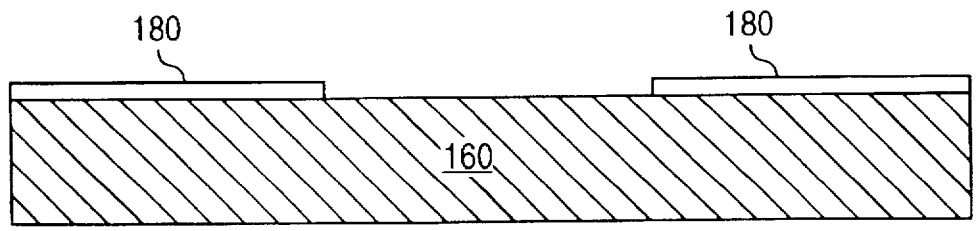
FIGS. 3, 4, 5, 6 and 7 are cross-sections of a semiconductor substrate showing a first embodiment for forming a phosphorus region employing an oxide on the surface of the substrate.
Figure 4:
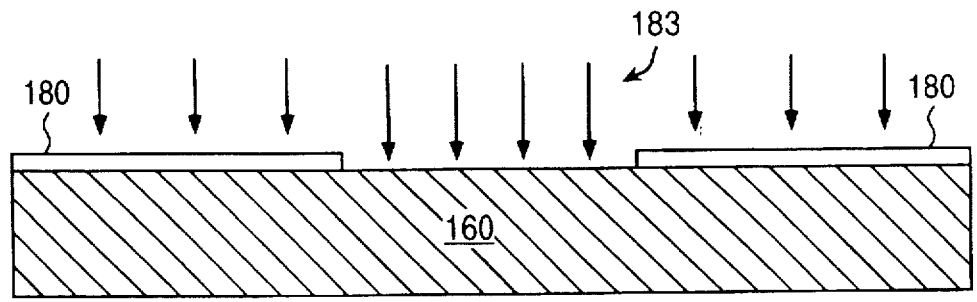

FIGS. 3–7 show the first embodiment of the present invention for annealing a damaged implant or dopant region, and for forming an oxide layer having at least a first thickness and a second thickness. FIG. 3 shows a semiconductor substrate 160 having formed thereon a mask layer 180. Mask layer 180 can comprise an oxide or photoresist layer. In an embodiment, mask layer 180 may not be positioned directly against substrate 160. As shown in FIG. 4, an ion implant represented by arrows 183 of an impurity, in general to a depth $(x_j)$ of about 150 nm, to form an implant region 170 (FIG. 5), is performed. The impurity may be phosphorus, arsenic, boron, or an equivalent. The implant can be a conventional process of beam line ion implantation, plasma source ion implantation, non-melt GILD or an equivalent thereof, which imparts dopant into the substrate.

Figure 5:
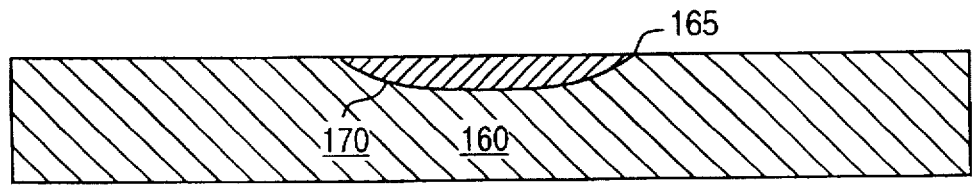

Such implantation will result in region 170, shown in FIG. 5, but will cause damage to the surface 165 of semiconductor substrate 160. In order to form operational semiconductor devices, and, for example, utilize an extremely thin oxide region over implant region 170, this damage must be removed. Conventional annealing is not sufficient to remove the damage within prescribed thermal budgets.

Figure 6:
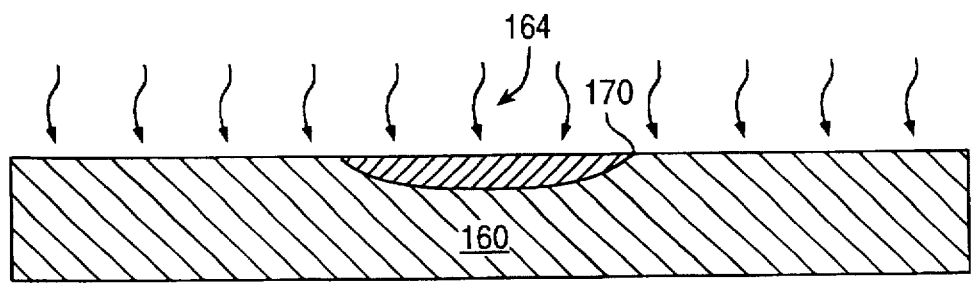

In accordance with the present invention, as shown in FIG. 6, laser energy represented by arrows 164 may be applied selectively to the surface of substrate 160 to melt the surface of the selected region to a sufficient junction depth to completely liquify the substrate to the depth of implant region 170. This can be accomplished by using a spatially homogenized 308 nm XeCl pulsed laser. The energy and power of the laser can vary in accordance with different applications. By melting the surface area of the substrate, within one microsecond the silicon will cool and reform epitaxially, thereby removing any damage incorporated by the implant process. The energy fluence of the laser at the surface of the sample determines the duration of the melt which occurs at the surface. The melt duration is related to the maximum melt depth. The relationship between melt time and maximum melt depth depends on the temporal profile of the laser beam. Precise control of junction depth is possible due to the capability of measuring the full width half maximum (FWHM) of the laser and the surface melt duration during the laser doping process. Relatively large changes in the energy fluence are required to create small changes in the maximum melt depth. The dosage is controlled by the total melt time. The total melt time can be varied by varying the number and/or energy of the laser pulses.

A laser having energy of approximately 750 mJ/cm² to 1.3 J/cm² results in junction depths ranging from 20 nanometers to 150 nanometers from a 308 nm excimer laser at a 9 Hz repetition rate.

The energy of the laser applied in this step can be controlled to an accuracy necessary to melt only the surface of the substrate to a depth that the dopant has been implanted into the substrate. The silicon is molten for approximately 30–100 nanoseconds. It will cool in approximately 1 microsecond. Upon cooling, the silicon will reform epitaxially and any damage which is imparted to the surface of the substrate 160 during the dopant process will be removed.

It should be recognized that the laser annealing method of the present invention can be utilized in accordance with other technologies. For example, a non-melt GILD (Gas Induced Laser Doping) process as described in the above-referenced patent application entitled A METHOD TO INCORPORATE, AND A DEVICE HAVING, OXIDE ENHANCEMENT DOPANTS USING GAS IMMERSION LASER DOPING (GILD) FOR SELECTIVELY GROWING AN OXIDE LAYER, filed concurrently herewith, may also impart damage to the substrate. In a GILD process, a substrate is placed in a dopant-containing atmosphere and laser energy is utilized to incorporate or deposit an oxidation enhancing impurity. A reflective reticle is used in incorporating the GILD process; the process does not require a separate masking layer, although a reflective masking layer such as tungsten, silicon nitride, molybdenum, silicon dioxide or an equivalent may be utilized. Laser energy is applied through the dopant-containing atmosphere to form a dopant-containing region, similar to 170, in the substrate. Absorbed dopant gas species diffuse into the molten silicon layer, and dopants are incorporated upon epitaxial regrowth. In a non-melt GILD process, the energy of the laser is reduced and the repetition rate of the laser pulser increased to provide solid phase diffusion of the dopant.

Figure 7:
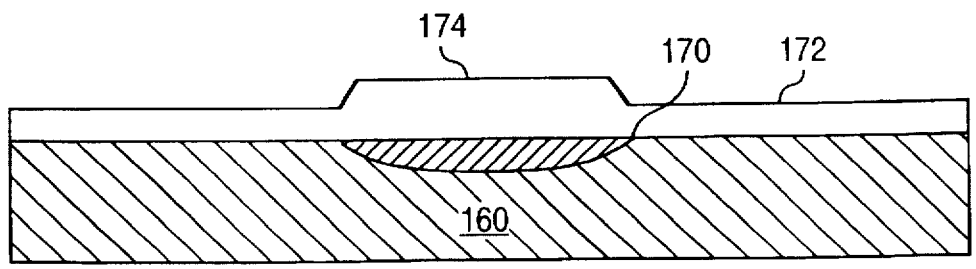

Subsequently, as shown in FIG. 7, substrate 160 can be placed in an oxygen containing atmosphere at a temperature of approximately 900° C. sufficient to thermally oxidize the surface of the substrate to grow an oxide layer 172 having a sufficient thickness on undoped regions of substrate 160, while growth in region 174 is enhanced by the laser annealed oxidation enhancing impurity region 170. In an embodiment, the resulting oxide region will have a first thickness of approximately 180 Å in region 174, and a second thickness of approximately 150 Å in the undoped regions of the substrate. In another embodiment, the oxide regions will have a first thickness of approximately 88 Å in region 174 and a second thickness of approximately 80 Å on undoped substrate.

The many features and advantages of the present invention should be apparent to one of average skill in the art. All such features and advantages are intended to be within the scope of the invention as defined by the present specification, and the following claims. It should be recognized that the method of the present invention is not limited to its uses in memory technology, but would be applicable in any semiconductor method fabrication process requiring a uniform and reliable oxide layer on a semiconductor substrate. The present invention provides a unique method for introducing an oxide enhancing compound, such as phosphorus, into a shallow region in the silicon substrate enabling the phosphorus doped regions to be useful in differential oxide growth by eliminating damage in the phosphorus doped regions.

What is claimed is:

1. A method of forming a region of impurity in a semiconductor substrate, comprising:
    (a) forming a mask layer on the surface of the semiconductor substrate;
    (b) patterning the mask layer to expose a portion of the semiconductor substrate;
    (c) forming an oxide growth enhancing impurity region in the semiconductor substrate;
    (d) applying laser energy to the semiconductor substrate at a sufficient magnitude to liquify the oxide growth enhancing impurity region; and
    (e) growing an oxide layer having a first thickness above the oxide growth enhancing region.

2. The method of claim 1, wherein the impurity is phosphorus.

3. The method of claim 1, wherein the impurity is arsenic.

4. The method of claim 1, wherein the impurity is boron.

5. The method of claim 1, wherein the step of forming an oxide growth enhancing impurity region comprises:
    (a) applying laser energy to the semiconductor substrate to incorporate the oxide growth enhancing impurity region in the semiconductor substrate.

6. The method of claim 1, wherein the step of forming an oxide growth enhancing impurity region comprises ion implanting the oxide growth enhancing impurity into the semiconductor substrate.

7. The method of claim 1, wherein the applying step comprises applying energy from an XeCl laser having a wavelength of 308 nm at an energy in a range of approximately 750 mJ/cm² to approximately 1.3 J/cm².

8. The method of claim 1, wherein the applying step comprises applying energy from an excimer laser.

9. A method of forming a region of oxide growth enhancing impurity in a semiconductor substrate, comprising:
    (a) forming a mask layer on a surface of the semiconductor substrate;
    (b) patterning the mask layer to expose a portion of the semiconductor substrate surface into which the oxide growth enhancing impurity is to be implanted;
    (c) implanting the oxide growth enhancing impurity into the exposed portion of the semiconductor substrate;
    (d) applying laser energy to the exposed portion of the semiconductor substrate surface at a sufficient magnitude to liquify the oxide growth enhancing impurity region; and
    (e) growing an oxide layer having a first thickness above the exposed portion of the semiconductor substrate and having a second thickness above a non-exposed portion of the semiconductor substrate, wherein the first thickness is greater than the second thickness.

10. The method of claim 9, wherein the applying step comprises applying energy from an XeCl laser having a wavelength of 308 nm at an energy in a range of approximately 750 mJ/cm² to approximately 1.3 J/cm².

11. The method of claim 9, wherein the applying step comprises applying energy from an excimer laser.

12. The method of claim 9, wherein the oxide growth enhancing impurity is phosphorus.

13. The method of claim 9, wherein the oxide growth enhancing impurity is arsenic.

14. The method of claim 9, wherein the oxide growth enhancing impurity is boron.

15. A method for forming a phosphorus region in a silicon substrate, comprising the steps of:

(a) forming the phosphorus region in the silicon substrate to a depth below a surface of the silicon substrate;

(b) applying laser energy to the surface of the silicon substrate at a sufficient energy and for a sufficient time to melt the phosphorus region to at least said depth; and (c) growing an oxide layer having a first thickness above the phosphorus region and a second thickness above the non-phosphorus region, wherein the first thickness is greater than the second thickness.

16. The method of claim 15, wherein the step of forming comprises:

(i) placing the silicon substrate in an atmosphere of a compound having phosphorus;

(ii) applying laser energy to the surface of the silicon substrate to incorporate the phosphorus into the phosphorus region.

17. The method of claim 15, wherein the step of forming comprises ion implanting the phosphorus into the silicon substrate.

18. The method of claim 15, further including the steps, prior to the forming step, of forming a mask layer on the surface of the silicon substrate, and patterning the mask layer to expose a portion of the substrate into which the phosphorus is formed.

19. A method for forming an oxide on a surface of a silicon substrate, comprising the steps of:

(a) forming a mask layer on the surface of the silicon substrate;

(b) patterning the mask layer to expose a portion of the silicon substrate;

(c) implanting phosphorus into the exposed portion of the silicon substrate to a depth below a surface of the substrate in order to form a program junction;

(d) applying laser energy to the surface of the exposed portion of the silicon substrate at a sufficient energy and for time to melt the substrate to approximately the depth of the phosphorus in the program junction; and (e) forming an oxide on the surface of the silicon substrate, at least a portion of the oxide being formed over the exposed portion of the substrate.

20. The method of claim 19, wherein the depth of the phosphorus is between approximately 20 nanometers and approximately 150 nanometers.

21. The method of claim 19, wherein the step (d) comprises applying energy from an XeCl laser having a wavelength of 308 nm at an energy in a range of approximately 750 mJ/cm$^2$ to approximately 1.3 J/cm$^2$.

22. The method of claim 19, wherein the step (d) comprises applying energy from an excimer laser.

23. The method of claim 19, wherein the step of implanting comprises ion implanting the phosphorus into the silicon substrate.

24. The method of claim 19 wherein the step of implanting comprises:

(i) placing the substrate in an atmosphere of a compound having phosphorus;

(ii) applying laser energy to the surface of the silicon substrate to incorporate the phosphorus into the exposed portion of the silicon substrate.

\* \* \* \* \*